US012696504B2

(12) United States Patent
Huang et al.

(10) Patent No.: US 12,696,504 B2
(45) Date of Patent: Jul. 28, 2026

(54) THIN FILM TRANSISTOR AND MANUFACTURING METHOD THEREOF

(71) Applicant: AUO Corporation, Hsin-Chu (TW)

(72) Inventors: Ya-Qin Huang, Hsin-Chu (TW); Wan-Ching Su, Hsin-Chu (TW); Yi-Da He, Hsin-Chu (TW); Ming-Wei Sun, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 411 days.

(21) Appl. No.: 18/542,310

(22) Filed: Dec. 15, 2023

(65) Prior Publication Data

US 2024/0395865 A1    Nov. 28, 2024

(30) Foreign Application Priority Data

May 24, 2023    (TW) ................................. 112119390

(51) Int. Cl.
  H10D 62/13      (2025.01)
  H10D 30/01      (2025.01)
       (Continued)

(52) U.S. Cl.
  CPC ....... H10D 62/151 (2025.01); H10D 30/0314 (2025.01); H10D 30/0321 (2025.01);
       (Continued)

(58) Field of Classification Search
  CPC ........... H10D 30/0314; H10D 30/0321; H10D 30/67; H10D 30/031; H10D 30/0318;
       (Continued)

(56) References Cited

U.S. PATENT DOCUMENTS 5,160,491 A    11/1992  Mori
7,132,685 B2 *  11/2006  Chen ................. H10D 30/6746
                                      257/E21.411

(Continued)

FOREIGN PATENT DOCUMENTS

TW        200421622 A    10/2004

OTHER PUBLICATIONS

Office Action issued by the (TIPO) Intellectual Property Office Ministry of Economic Affairs R.O.C. Taiwan Intellectual 1 Property Office on Jan. 16, 2024, Application No. 112119390, Taiwan.

*Primary Examiner* — Chad M Dicke
*Assistant Examiner* — Priya M Rampersaud
(74) *Attorney, Agent, or Firm* — Tim Tingkang Xia, Esq.; Troutman Pepper Locke LLP

(57)                ABSTRACT

A thin film transistor includes a semiconductor layer, a gate insulating layer, a gate, a source and a drain. The semiconductor layer has a first heavily doped region, a second heavily doped region, a third heavily doped region, an intrinsic region and a lightly doped region. The gate shields the intrinsic region and a first portion of the first heavily doped region. A second portion of the first heavily doped region is located outside an area of the gate. The source and the drain are electrically connected to the second heavily doped region and the third heavily doped region respectively. The source and the drain are arranged in a first direction. The first portion of the first heavily doped region and the gate have an overlapping region. A length of the overlapping region in the first direction is greater than a length of the intrinsic region in the first direction.

10 Claims, 11 Drawing Sheets

(51) Int. Cl.
    *H10D 30/67*         (2025.01)
    *H10P 30/20*         (2026.01)
    *H10P 30/22*         (2026.01)

(52) U.S. Cl.
    CPC ....... H10D 30/6757 (2025.01); *H10P 30/204*
        (2026.01); *H10P 30/21* (2026.01); *H10P 30/22*
        (2026.01)

(58) Field of Classification Search
    CPC ........... H10D 30/6731; H10D 30/6732; H10D
        30/6715; H10D 30/673; H10D 30/6757;
        H10D 62/151; H10D 30/0312; H10D
        30/603; H10D 30/6717; H10D 86/0221;
        H10D 86/425; H10P 30/204; H10P 30/21;
        H10P 30/22
    See application file for complete search history.

(56)               References Cited

U.S. PATENT DOCUMENTS

| | | | |
|---|---|---|---|
| 7,791,073 B2 | 9/2010 | Tokioka et al. | |
| 2010/0327353 A1* | 12/2010 | Shoji ................... | H10D 30/673 |
| | | | 257/E29.273 |

* cited by examiner

THIN FILM TRANSISTOR AND MANUFACTURING METHOD THEREOF

CROSS-REFERENCE TO RELATED PATENT APPLICATION

This non-provisional application claims priority to and the benefit of, pursuant to 35 U.S.C. § 119(a), patent application No. 112119390 filed in Taiwan on May 24, 2023. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a semiconductor component and a manufacturing method thereof, and particularly to a thin film transistor and a manufacturing method thereof.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A display panel includes a thin film transistor substrate, an opposite substrate and a plurality of light emitting components electrically connected to the thin film transistor substrate. The light emitting components are driven by the thin film transistors of the thin film transistor substrate. If each light emitting component is a current driven component, the corresponding thin film transistor is required to provide a greater on-current. To increase the on-current of the thin film transistor, the channel length of the thin film transistor may be shortened. Generally, the channel length of the thin film transistor is mostly determined by the gate width of the thin film transistor. However, limited by the capability of photolithography, the reduction in the gate width is limited, leading to a limited increase in the on-current of the thin-film transistor.

SUMMARY

One aspect of the present disclosure provides a manufacturing method of a thin film transistor capable of fabricating a thin film transistor with a short channel length.

Another aspect of the present disclosure provides a thin film transistor capable with a short channel length and a large on-current.

The manufacturing method of the thin film transistor according to one aspect of the present disclosure includes the following steps: forming an intrinsic semiconductor layer on a substrate; performing a first ion implantation to form a first heavily doped region and an intrinsic region outside the first heavily doped region on the intrinsic semiconductor layer; forming a gate insulating layer on the first heavily doped region and the intrinsic region; forming a quasi gate on the gate insulating layer, wherein the first heavily doped region includes a first portion and a second portion, the intrinsic region includes a first portion, a second portion and a third portion, the first portion of the first heavily doped region and the first portion of the intrinsic region are directly connected, the second portion of the first heavily doped region is located between the second portion of the intrinsic region and the first portion of the first heavily doped region, the first portion of the intrinsic region is located between the first portion of the first heavily doped region and the third portion of the intrinsic region, the quasi gate shields the first portion of the first heavily doped region and the first portion of the intrinsic region, and the second portion of the first heavily doped region, the second portion of the intrinsic region and the third portion of the intrinsic region are located outside an area of the quasi gate; performing a second ion implantation with the quasi gate as a mask to form a second heavily doped region and a third heavily doped region in the second portion of the intrinsic region and the third portion of the intrinsic region; and forming a source and a drain, wherein the source and the drain are electrically connected to the second heavily doped region and the third heavily doped region respectively.

The thin film transistor according to another aspect of the present disclosure includes a semiconductor layer, a gate insulating layer, a gate, a source and a drain. The semiconductor layer has a first heavily doped region, a second heavily doped region, a third heavily doped region, an intrinsic region and a lightly doped region. The first heavily doped region is disposed between the second heavily doped region and the intrinsic region. The intrinsic region is disposed between the first heavily doped region and the lightly doped region. The lightly doped region is disposed between the intrinsic region and the third heavily doped region. A boundary exists between the intrinsic region and the lightly doped region. The gate insulating layer is disposed on the semiconductor layer. The first heavily doped region includes a first portion and a second portion. The gate shields the intrinsic region and the first portion of the first heavily doped region. The second portion of the first heavily doped region is located outside an area of the gate. The source and the drain are electrically connected to the second heavily doped region and the third heavily doped region of the semiconductor layer respectively. The source and the drain are arranged in a first direction. The first portion of the first heavily doped region and the gate have an overlapping region. A length of the overlapping region in the first direction is greater than a length of the intrinsic region in the first direction.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1A:
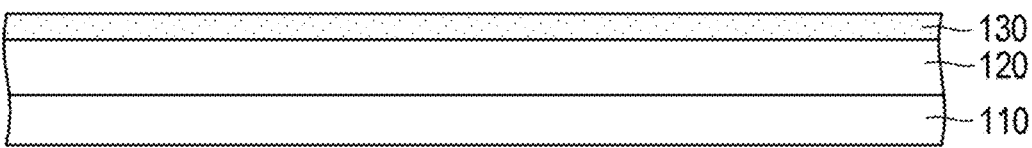
FIG. 1A to FIG. 1I are sectional schematic views of a manufacturing process of a thin film transistor according to a first embodiment of the present disclosure.

The present disclosure will now be described hereinafter in details with reference to the accompanying drawings, in which exemplary embodiments of the disclosure are shown. If possible, identical reference numerals refer to identical or like elements in the drawings and descriptions.

It should be understood that when one component such as a layer, a film, a region or a substrate is referred to as being disposed "on" the other component or "connected to" the other component, the component may be directly disposed on the other component or connected to the other component, or an intermediate component may also exist between the two components. In contrast, when one component is referred to as being "directly disposed on the other component" or "directly connected to" the other component, no intermediate component exists therebetween. As used herein, a "connection" may be a physical and/or electrical connection. In addition, when two components are "electrically connected" or "coupled", other components may exist between the two components.

The terms "about", "approximately" or "substantially" as used herein shall cover the values described, and cover an average value of an acceptable deviation range of the specific values ascertained by one of ordinary skill in the art, where the deviation range may be determined by the measurement described and specific quantities of errors related to the measurement (that is, the limitations of the measuring system). For example, the term "about" represents within one or more standard deviations of a given value of range, such as within ±30 percent, within ±20 percent, within ±10 percent or within ±5 percent. Moreover, the terms "about", "approximately" or "substantially" as used herein may selectively refer to a more acceptable deviation range or the standard deviation based on the optical characteristics, the etching characteristics or other characteristics, without applying one standard deviation to all characteristics.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1A to FIG. 1I are sectional schematic views of a manufacturing process of a thin film transistor according to a first embodiment of the present disclosure.

Referring to FIG. 1A, firstly, an intrinsic semiconductor layer 130 is formed on a substrate 110. Specifically, in the present embodiment, a buffer layer 120 may firstly be selectively formed on the substrate 110. Then, the intrinsic semiconductor layer 130 is formed on the buffer layer 120. However, the present disclosure is not limited thereto.

In the present embodiment, the material of the substrate 110 may be glass, quartz, organic polymers, an opaque/reflective material (such as a conductive material, a wafer, ceramic, or other suitable materials), or other suitable material. In the present embodiment, the material of the buffer layer 120 may be an inorganic material (such as silicon oxide, silicon nitride, silicon oxynitride, or a stack layer of at least two of the aforementioned materials), an organic material or a combination thereof. In the present embodiment, the material of the intrinsic semiconductor layer 130 may be, for example, undoped polycrystalline silicon, but the present disclosure is not limited thereto.

Figure 1B:
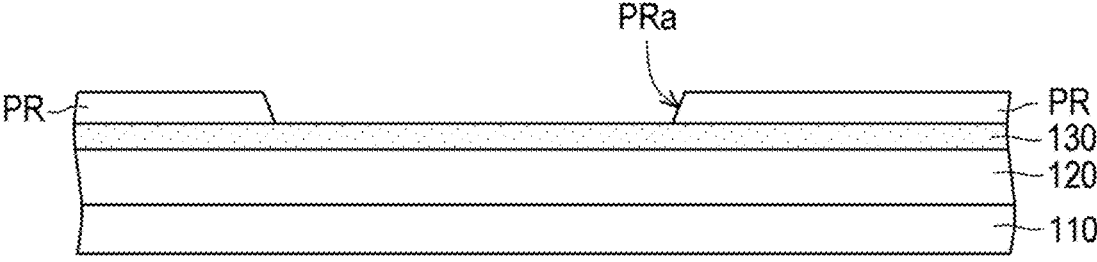
Figure 1C:
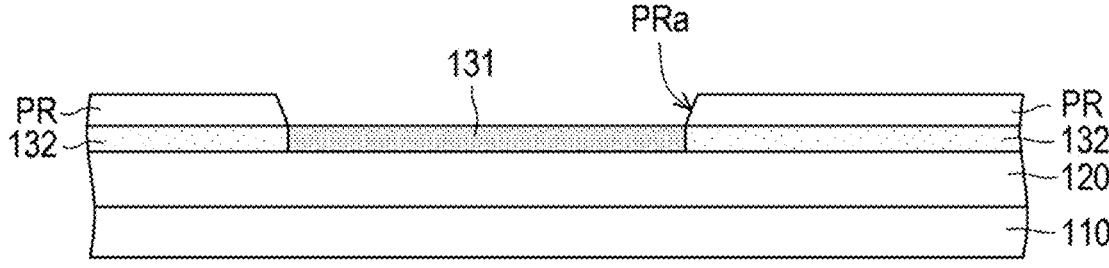
Figure 1D:
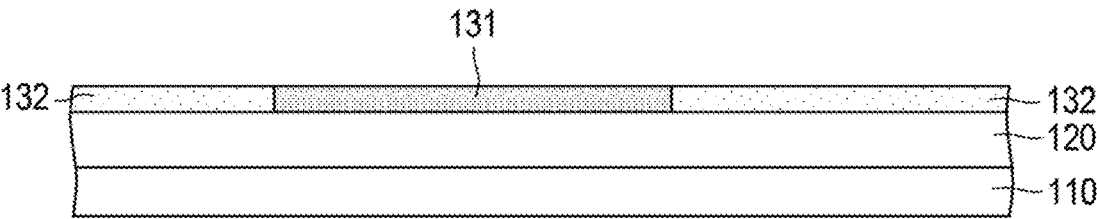

Referring to FIG. 1B, FIG. 1C and FIG. 1D, subsequently, a first ion implantation is performed to form a first heavily doped region 131 and an intrinsic region 132 outside the first heavily doped region 131 on the intrinsic semiconductor layer 130. Specifically, in the present embodiment, a photoresist layer PR may be formed on the intrinsic semiconductor layer 130, where the photoresist layer PR has an opening PRa exposing a portion of the intrinsic semiconductor layer 130. Subsequently, the first ion implantation is performed with the photoresist layer PR as a mask to form the first heavily doped region 131 in the portion of the intrinsic semiconductor layer 130 overlapping with the opening PRa, and to form the intrinsic region 132 in the other portion of the intrinsic semiconductor layer 130 shielded by the photoresist layer PR. Then, the photoresist layer PR is removed to expose the intrinsic region 132.

Figures 1E, 1F:
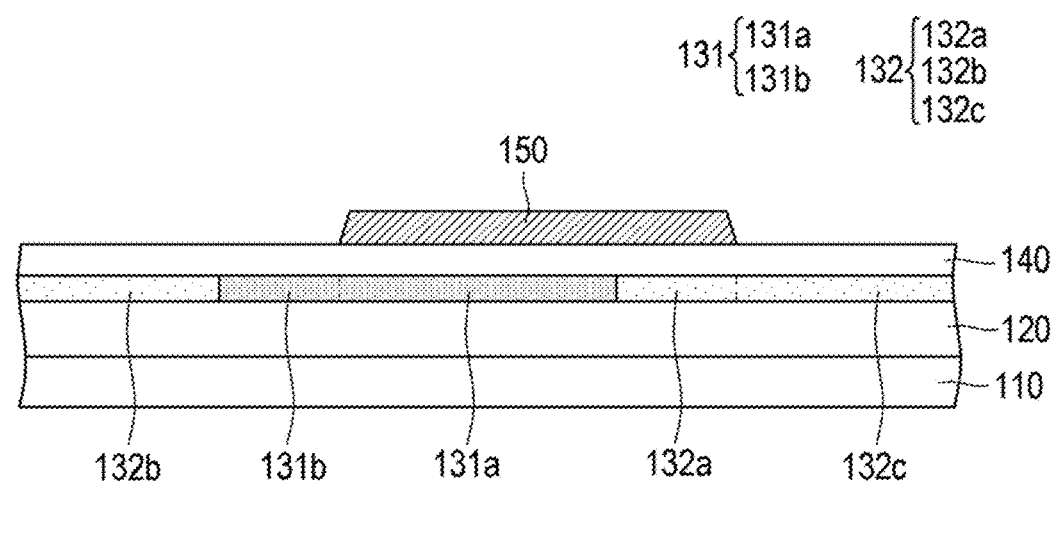

Referring to FIG. 1E, subsequently, a gate insulating layer 140 is formed on the first heavily doped region 131 and the intrinsic region 132. In the present embodiment, the material of the gate insulating layer 140 may be an inorganic material (such as silicon oxide, silicon nitride, silicon oxynitride, or a stack layer of at least two of the aforementioned materials), an organic material or a combination thereof.

Referring to FIG. 1E, subsequently, a quasi gate 150 is formed on the gate insulating layer 140. The first heavily doped region 131 includes a first portion 131a and a second portion 131b, and the intrinsic region 132 includes a first portion 132a, a second portion 132b and a third portion 132c. The first portion 131a of the first heavily doped region 131 and the first portion 132a of the intrinsic region 132 are directly connected. The second portion 131b of the first heavily doped region 131 is located between the second portion 132b of the intrinsic region 132 and the first portion 131a of the first heavily doped region 131. The first portion 132a of the intrinsic region 312 is located between the first portion 131a of the first heavily doped region 131 and the third portion 132c of the intrinsic region 132. The quasi gate 150 shields the first portion 131a of the first heavily doped region 131 and the first portion 132a of the intrinsic region 132. The second portion 131b of the first heavily doped region 131, the second portion 132b of the intrinsic region 132 and the third portion 132c of the intrinsic region 132 are located outside an area of the quasi gate 150.

In the present embodiment, based on the consideration of the electrical conductivity, the quasi gate 150 generally uses a metal material. However, the present disclosure is not limited thereto. According to other embodiments, the quasi gate 150 may also use other conductive materials, such as an alloy, nitride of the metal material, oxide of the metal material, oxynitride of the metal material, or a stack layer of the metal material and other conductive materials.

Referring to FIG. 1E and FIG. 1F, subsequently, a second ion implantation is performed with the quasi gate 150 as a mask to form a second heavily doped region 132bh and a third heavily doped region 132ch in the second portion 132b of the intrinsic region 132 and the third portion 132c of the intrinsic region 132. The second heavily doped region 132bh and the third heavily doped region 132ch are formed in the same ion implantation process, and the doping concentrations of the second heavily doped region 132bh and the third heavily doped region 132ch are identical. The first heavily doped region 131 and the second heavily doped region 132bh are formed in the first ion implantation process and the second ion implantation process respectively, and the doping concentrations of the first heavily doped region 131 and the second heavily doped region 132bh may be identical or different.

Referring to FIG. 1F, for example, in the present embodiment, the doping concentrations of the first heavily doped region 131 and the second heavily doped region 132bh may selectively be different (for example, the doping concentration of the first heavily doped region 131 is higher than the doping concentration of the second heavily doped region 132bh), and a boundary I2 may exist between the second portion 131b of the first heavily doped region 131 and the second heavily doped region 132bh. It should be noted that, practically, the boundary I2 is invisible, and the boundary I2 is a virtual boundary between the two regions with different doping concentrations. The doping concentrations of the second portion 131b of the first heavily doped region 131 and the second heavily doped region 132bh may be analyzed utilizing an instrument, and the location where the doping concentration changes sharply is the location of the virtual boundary (that is, the boundary I2).

Figure 1G:
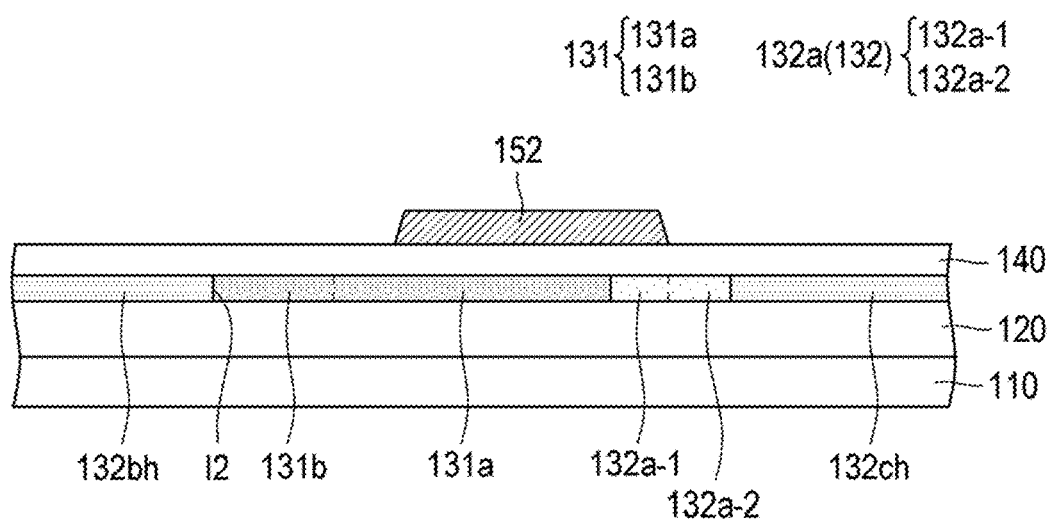

Referring to FIG. 1F and FIG. 1G, subsequently, the quasi gate 150 is etched to form a gate 152 with a smaller area. The first portion 132a of the intrinsic region 132 includes a first sub portion 132a-1 and a second sub portion 132a-2 connected to each other. The gate 152 shields the first sub portion 132a-1 of the first portion 132a of the intrinsic region 132, and the second sub portion 132a-2 of the first portion 132a of the intrinsic region 132 is located outside the area of the gate 152. the second sub portion 132a-2 of the first portion 132a of the intrinsic region 132 is located between the first sub portion 132a-1 of the first portion 132a of the intrinsic region 132 and the third heavily doped region 132ch.

Figure 1H:
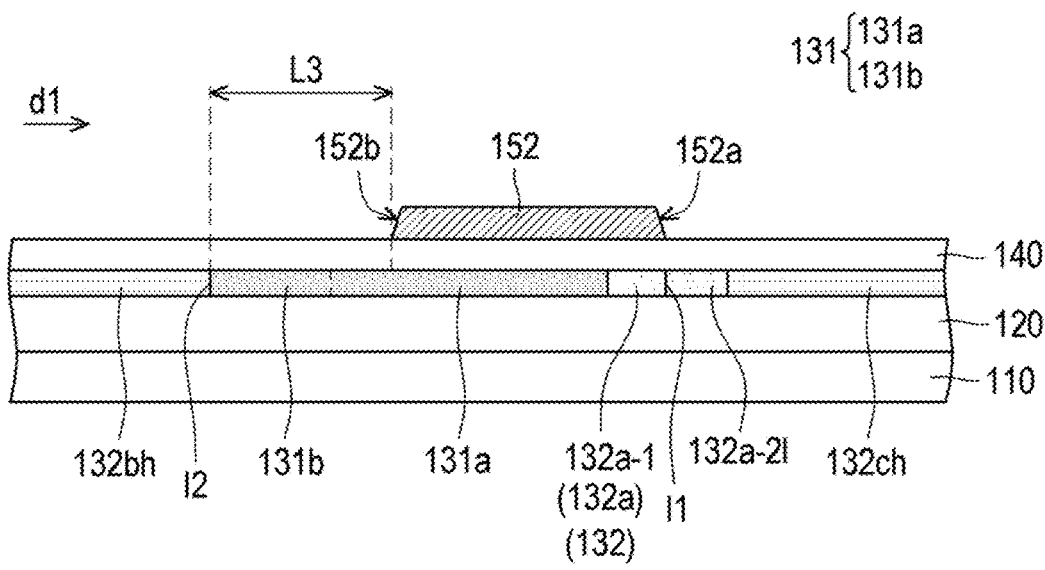

Referring to FIG. 1G and FIG. 1H, subsequently, a third ion implantation is performed with the gate 152 as a mask to form a lightly doped region 132a-2l in the second sub portion 132a-2 of the first portion 132a of the intrinsic region 132. Referring to FIG. 1H, the doping concentration of the lightly doped region 132a-2l is higher than the doping concentration of the first sub portion 132a-1 of the first portion 132a of the intrinsic region 132, and the doping concentration of the lightly doped region 132a-2l is lower than the doping concentrations of the first heavily doped region 131, the second heavily doped region 132bh and the third heavily doped region 132ch.

In the present embodiment, a boundary I1 exists between the first sub portion 132a-1 of the intrinsic region 132 and the lightly doped region 132a-2l, and the gate 152 has a first edge 152a and a second edge 152b opposite to each other. The boundary I1 between the first sub portion 132a-1 and the intrinsic region 132 and the lightly doped region 132a-2l is substantially aligned with the first edge 152a of the gate 152. The boundary I2 between the second portion 131b of the first heavily doped region 131 and the second heavily doped region 132bh is separated from the second edge 152b of the gate 152 by a distance L3 in a first direction d1. The second edge 152b of the gate 152 overlaps with the first portion 131a of the first heavily doped region 131. In other words, the second edge 152b of the gate 152 falls within the first heavily doped region 131 and not at the edge of the first heavily doped region 131.

Figure 1I:
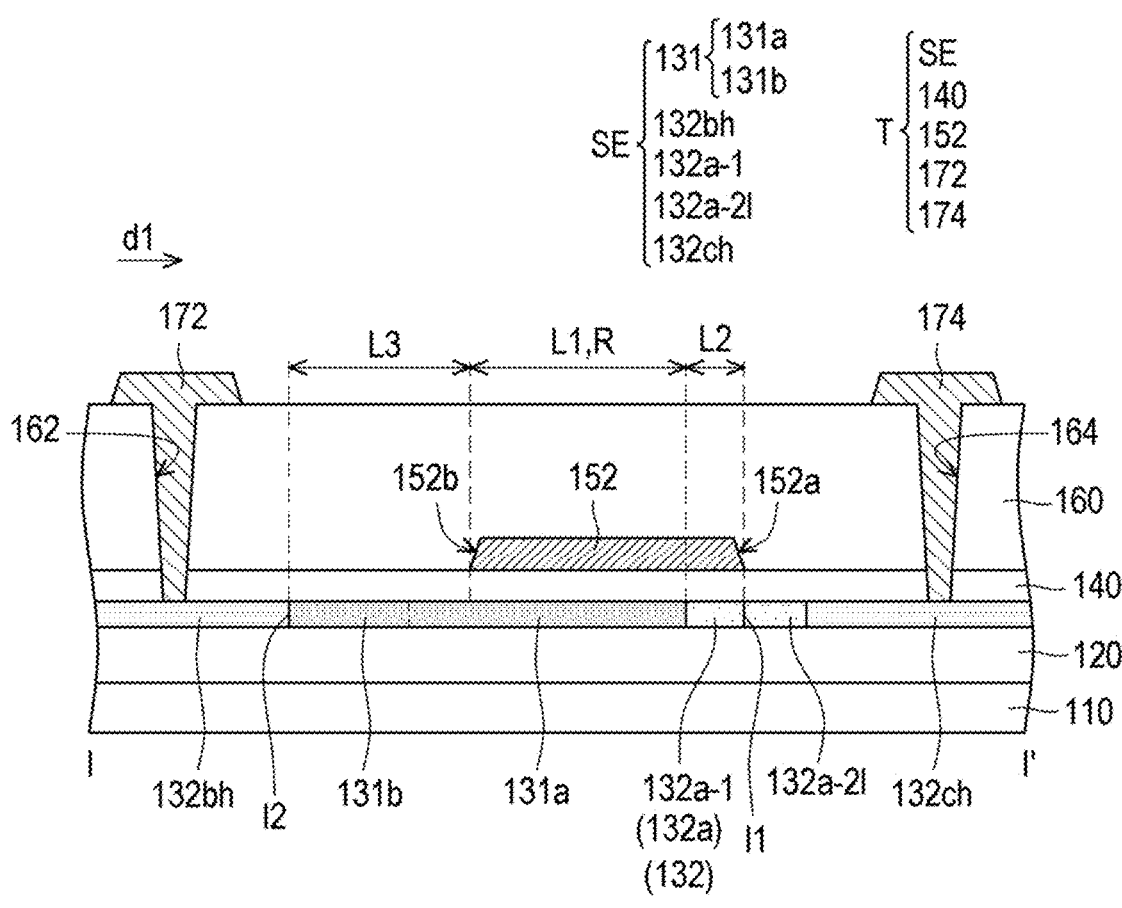

Referring to FIG. 1I, subsequently, a source 172 and a drain 174 are formed, where the source 172 and the drain 174 are electrically connected to the second heavily doped region 132bh and the third heavily doped region 132ch respectively. Specifically, in the present embodiment, an intermediate dielectric layer 160 is firstly formed on the gate 152 and the gate insulating layer 140. Then, the source 172 and the drain 174 are formed on the intermediate dielectric layer 160, where the source 172 and the drain 174 are electrically connected to the second heavily doped region 132bh and the third heavily doped region 132ch respectively through contact windows 162, 164 of the intermediate dielectric layer 160. Thus, the thin film transistor T in the present embodiment is completed.

In the present embodiment, based on the consideration of the electrical conductivity, the source 172 and the drain 174 generally use a metal material. However, the present disclosure is not limited thereto. According to other embodiments, the source 172 and the drain 174 may also use other conductive materials, such as an alloy, nitride of the metal material, oxide of the metal material, oxynitride of the metal material, or a stack layer of the metal material and other conductive materials.

Figure 2:
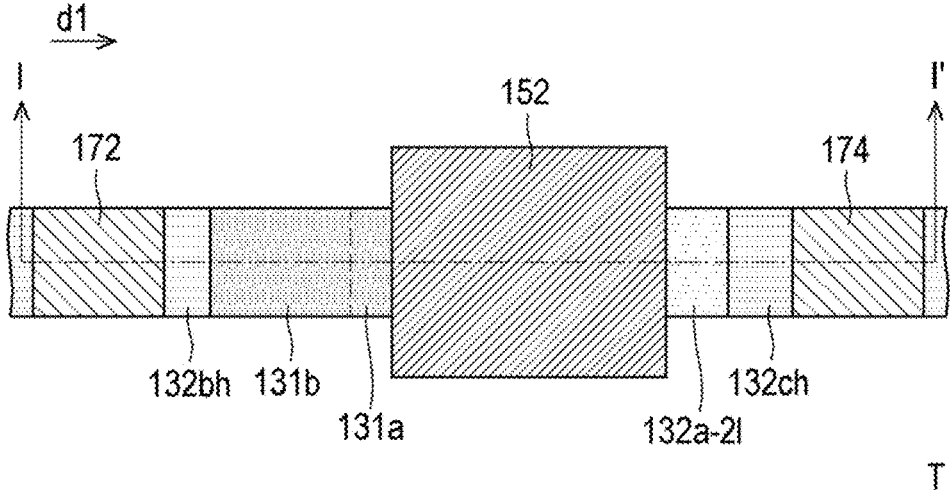
FIG. 2 is a top schematic view of the thin film transistor according to the first embodiment of the present disclosure.
Figure 3:
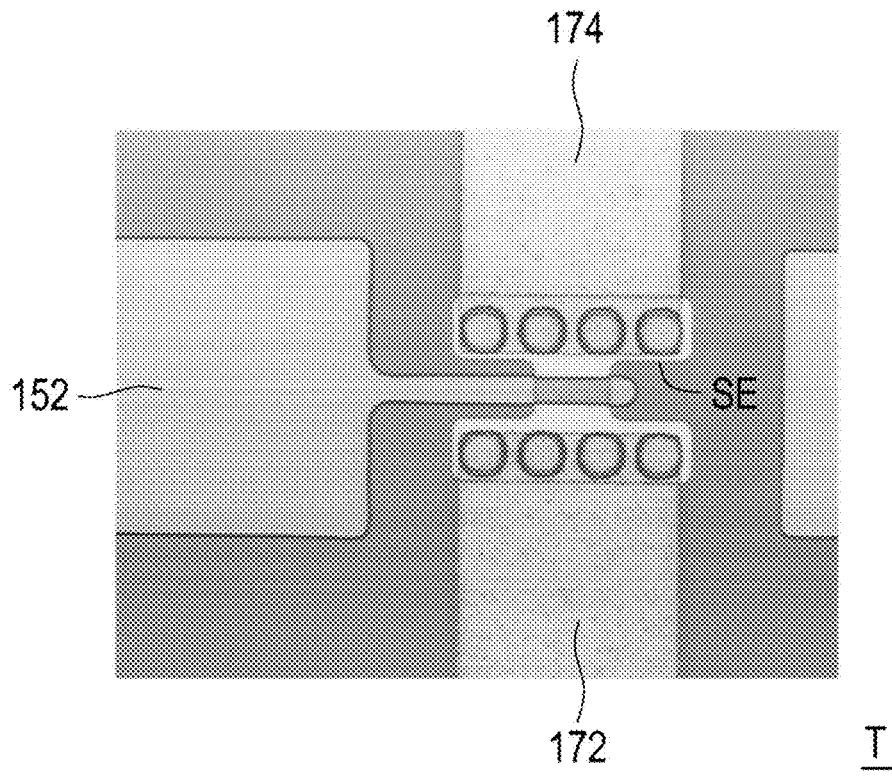
FIG. 3 is a top photograph of the thin film transistor according to the first embodiment of the present disclosure.

FIG. 2 is a top schematic view of the thin film transistor according to the first embodiment of the present disclosure. FIG. 1I corresponds to the sectional line I-I' of FIG. 2. FIG. 3 is a top photograph of the thin film transistor according to the first embodiment of the present disclosure.

Referring to FIG. 1I, FIG. 2 and FIG. 3, the thin film transistor T includes a semiconductor layer SE, a gate insulating layer 140, a gate 152, a source 172 and a drain 174. The semiconductor layer SE has a first heavily doped region 131, a second heavily doped region 132bh, a third heavily doped region 132ch, an intrinsic region 132 and a lightly doped region 132a-2l. The first heavily doped region 131 is disposed between the second heavily doped region 132bh and the intrinsic region 132. The intrinsic region 132 is disposed between the first heavily doped region 131 and the lightly doped region 132a-2l. The lightly doped region 132a-2l is disposed between the intrinsic region 132 and the third heavily doped region 132ch. A boundary I1 exists between the intrinsic region 132 and the lightly doped region 132a-2l.

The gate insulating layer 140 is disposed on the semiconductor layer SE. The gate 152 is disposed on the gate insulating layer 140. The first heavily doped region 131 includes a first portion 131a and a second portion 131b. The gate 152 shields the intrinsic region 132 and the first portion 131a of the first heavily doped region 131. The second portion 131b of the first heavily doped region 131 is located outside an area of the gate 152. The source 172 and the drain 174 are electrically connected to the second heavily doped region 132bh and the third heavily doped region 132ch of the semiconductor layer SE respectively. The source 172 and the drain 174 are arranged in a first direction d1. The first portion 131a of the first heavily doped region 131 and the gate 152 have an overlapping region R. A length L1 of the overlapping region R in the first direction d1 is greater than a length L2 of the intrinsic region 132 in the first direction d1. The intrinsic region 132 is the channel of the thin film transistor T. The length L2 of the intrinsic region 132 in the first direction d1 is the channel length of the thin film transistor T.

Referring to FIG. 1F, FIG. 1G and FIG. 1H, it should be noted that in the manufacturing process of the thin film transistor T, the deviation of the quasi gate 150 and the first heavily doped region 131 (as shown in FIG. 1F) is utilized to further define the intrinsic region 132 (as shown in FIG. 1H) which functions as the channel of the thin film transistor T. The deviation of the quasi gate 150 and the first heavily doped region 131 has a high controllable accuracy. Thus, the intrinsic region 132 with a shorter length (that is, the channel with a shorter length) may be fabricated, thus enhancing the on-current of the thin film transistor T. Referring to FIG. 1I and FIG. 2, for example, in the present embodiment, the length L2 of the intrinsic region 132 in the first direction d1 (that is, the channel length of the thin film transistor T) may be less than or equal to 1.5 μm, but the present disclosure is not limited thereto.

It should be noted that the following embodiment uses the reference numerals and certain contents of the aforementioned embodiment, in which identical reference numerals are used to represent identical or similar components, and descriptions of the identical technical contents will be omitted. The omitted descriptions may be referenced to in the aforementioned embodiment, and are not further reiterated in the following embodiment.

Figure 4:
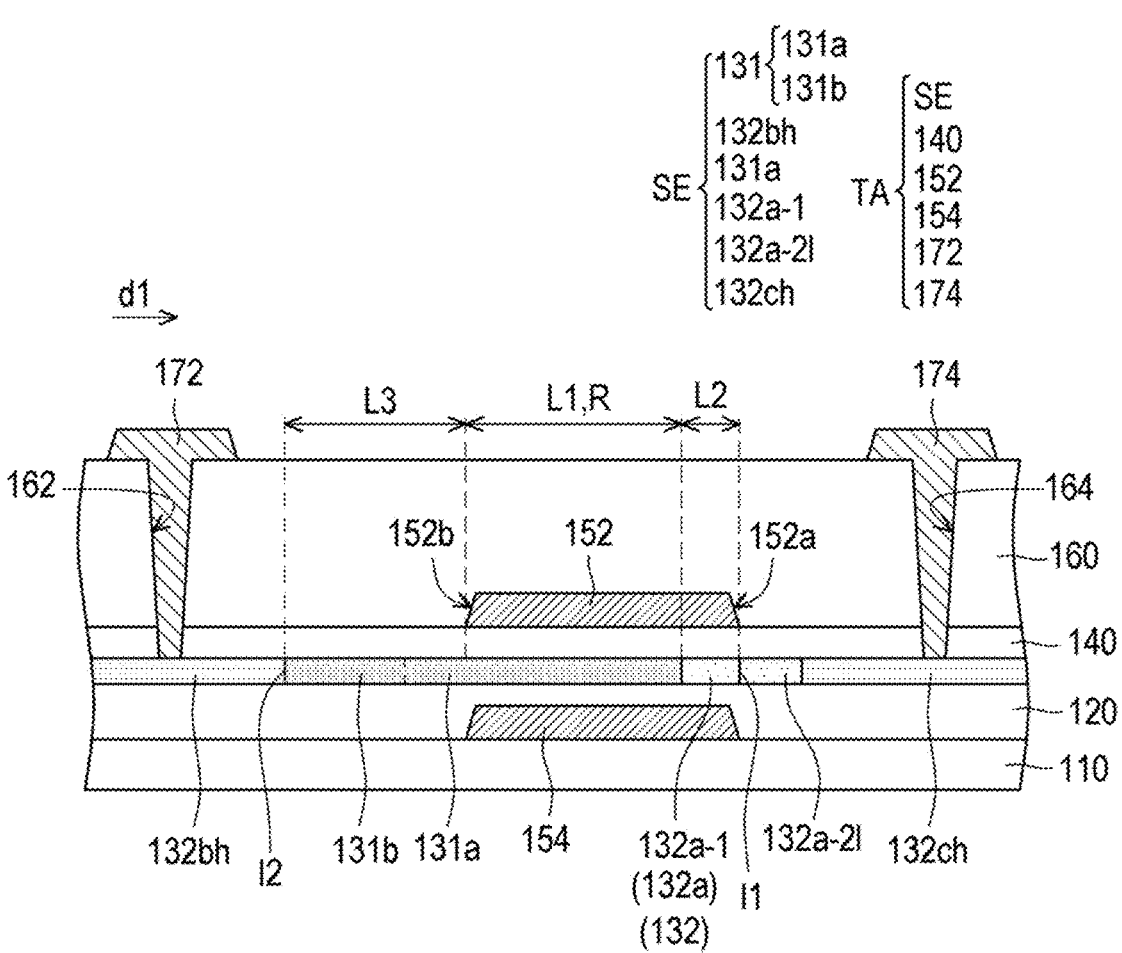
FIG. 4 is a sectional schematic view of a thin film transistor according to a second embodiment of the present disclosure.
Figure 5:
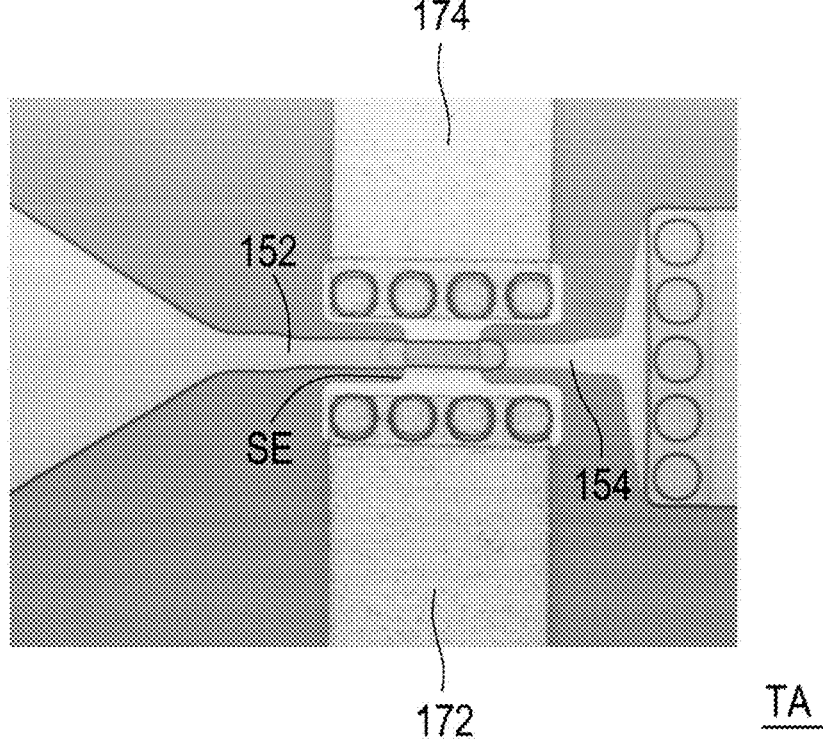
FIG. 5 is a top photograph of the thin film transistor according to the second embodiment of the present disclosure.

FIG. 4 is a sectional schematic view of a thin film transistor according to a second embodiment of the present disclosure. FIG. 5 is a top photograph of the thin film transistor according to the second embodiment of the present disclosure. The thin film transistor TA in the second embodiment is similar to the thin film transistor T in the first embodiment, and the difference between the two exists in that: the thin film transistor TA in the second embodiment further has another gate 154. The gate 152 and the gate 154 are respectively disposed at an upper side and a lower side of the semiconductor layer SE. The thin film transistor T in the first embodiment is a top-gate thin film transistor, and the thin film transistor TA in the second embodiment is a double-gate thin film transistor.

Figure 6:
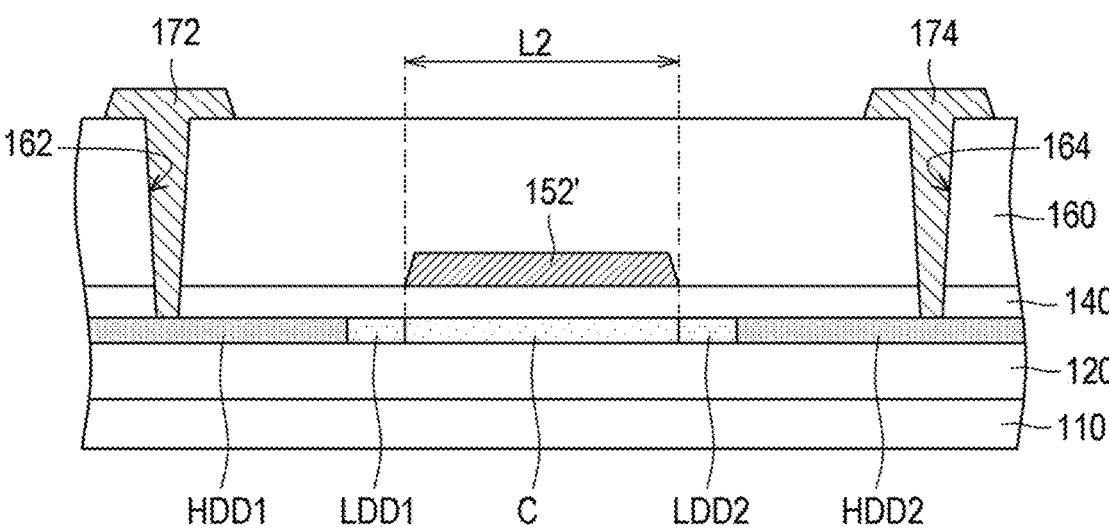
FIG. 6 is a sectional schematic view of a thin film transistor according to a comparative embodiment.
Figure 7:
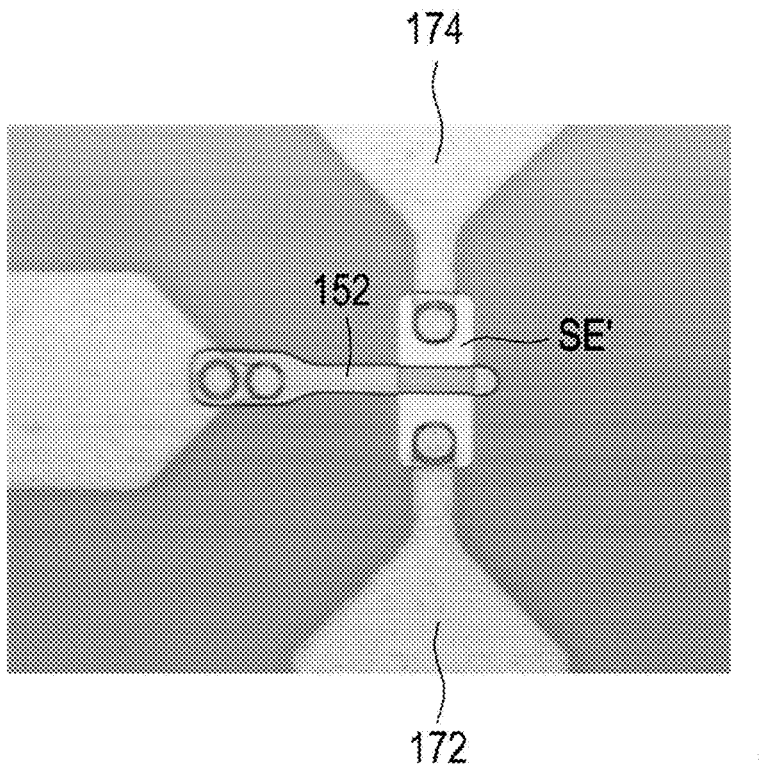
FIG. 7 is a top photograph of the thin film transistor according to the comparative embodiment.

FIG. 6 is a sectional schematic view of a thin film transistor according to a comparative embodiment. FIG. 7 is a top photograph of the thin film transistor according to the comparative embodiment. The thin film transistor T' in the comparative embodiment is similar to the thin film transistor T in the first embodiment, and the difference of the two exists in that: the relative positions of each of the regions of the semiconductor layers SE, SE' and the gates 152, 152' of the two are different.

Specifically, in the comparative embodiment of FIG. 6 and FIG. 7, the semiconductor layer SE' includes an intrinsic region C, a first lightly doped region LDD1 and a second lightly doped region LDD2 located at two sides of the intrinsic region C, a first heavily doped region HDD1 located near the first lightly doped region LDD1, and a second heavily doped region HDD2 located near the second lightly doped region LDD2. The gate 152' is aligned with the intrinsic region C. The first lightly doped region LDD1, the second lightly doped region LDD2, the first heavily doped region HDD1 and the second heavily doped region HDD2 are located outside the area of the gate 152'. The source 172 and the drain 174 are electrically connected to the first heavily doped region HDD1 and the second heavily doped region HDD2 respectively.

Figure 8:
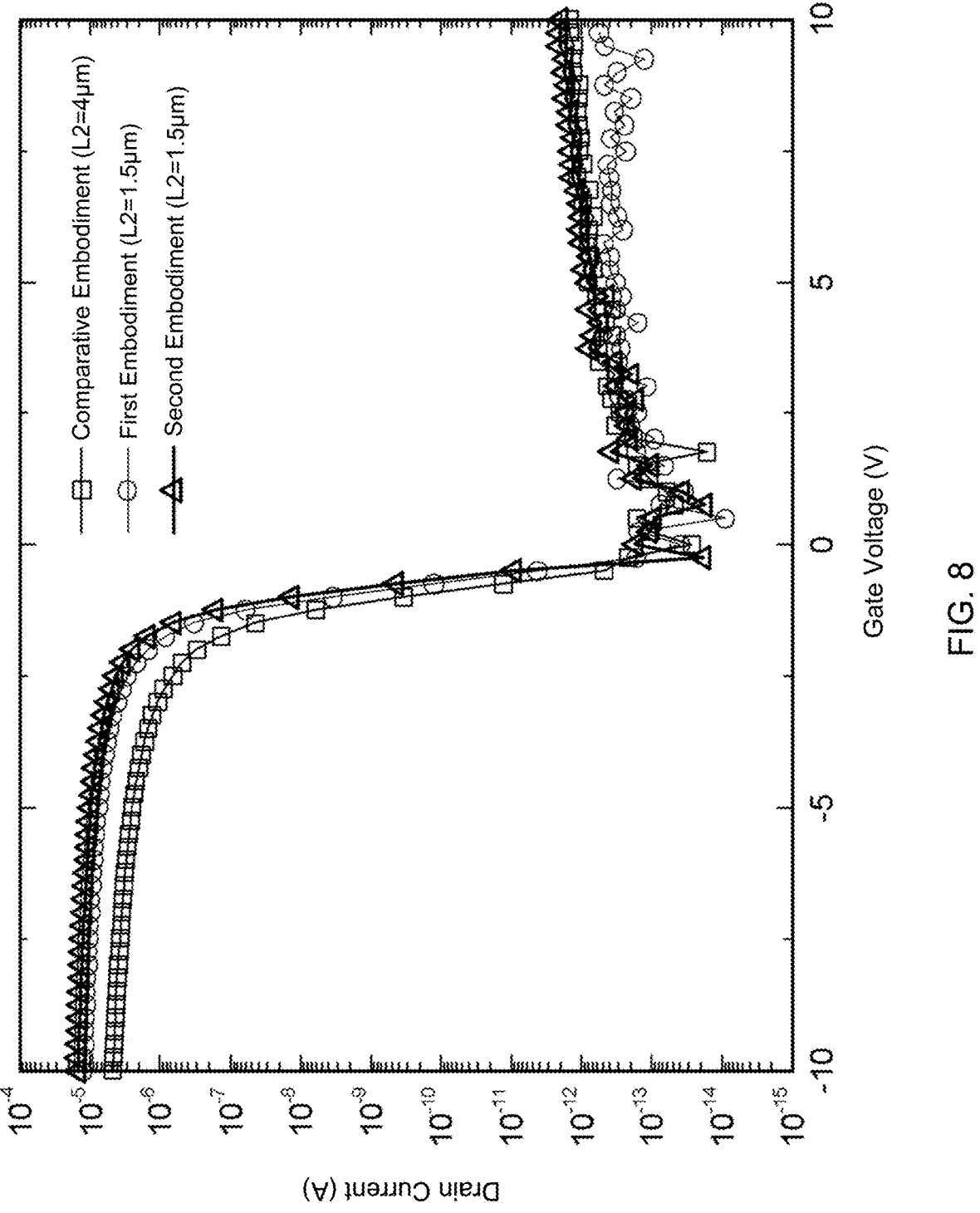
FIG. 8 is a curve chart showing relationships of the gate voltage and the drain current of the thin film transistors in the comparative embodiment, the first embodiment and the second embodiment.

Table 1 lists the channel size, type and various electrical properties of the thin film transistors in the comparative embodiment, the first embodiment and the second embodiment. FIG. 8 is a curve chart showing relationships of the gate voltage and the drain current of the thin film transistors in the comparative embodiment, the first embodiment and the second embodiment. As shown in Table 1 and FIG. 8, compared to the thin film transistor T' in the comparative embodiment, the channel lengths L2 of the thin film transistors T, TA in the first embodiment and the second embodiment are shorter, and the on-currents of the thin film transistors T, TA in the first embodiment and the second embodiment are respectively 3.12 times and 4.42 times of the on-current of the thin film transistor T' in the comparative embodiment. In addition, other electrical properties of the thin film transistors T, TA in the first embodiment and the second embodiment are also at the comparable level to those of the thin film transistor T' in the comparative embodiment.

TABLE 1

| | Thin film transistor T' in the comparative embodiment | Thin film transistor T in the first embodiment | Thin film transistor TA in the second embodiment |
|---|---|---|---|
| Channel size | Width = 12 μm Length L2 = 4 μm | Width = 12 μm Length L2 = 1.5 μm | Width = 12 μm Length L2 = 1.5 μm |
| Type | Top-gate | Top-gate | Double-gate |
| Threshold voltage (V) (Drain voltage Vd = −0.1 V) | −1.11 | −1.02 | −0.90 |
| Subthreshold swing (V/dec) | 0.18 | 0.18 | 0.18 |
| Carrier mobility (cm²/Vs) | 66.19 | 81.93 | 111.72 |
| On-current (μA) (Drain voltage = −5.1 V, gate voltage = −5 V) | 80.39 | 250.48 | 355.00 |

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A manufacturing method of a thin film transistor, comprising:

forming an intrinsic semiconductor layer on a substrate;

performing a first ion implantation to form a first heavily doped region and an intrinsic region outside the first heavily doped region on the intrinsic semiconductor layer;

forming a gate insulating layer on the first heavily doped region and the intrinsic region;

forming a quasi gate on the gate insulating layer, wherein the first heavily doped region includes a first portion and a second portion, the intrinsic region includes a first portion, a second portion and a third portion, the first portion of the first heavily doped region and the first portion of the intrinsic region are directly connected, the second portion of the first heavily doped region is located between the second portion of the intrinsic region and the first portion of the first heavily doped region, the first portion of the intrinsic region is located between the first portion of the first heavily doped region and the third portion of the intrinsic region, the quasi gate shields the first portion of the first heavily doped region and the first portion of the intrinsic region, and the second portion of the first heavily doped region, the second portion of the intrinsic region and the third portion of the intrinsic region are located outside an area of the quasi gate;

performing a second ion implantation with the quasi gate as a mask to form a second heavily doped region and a third heavily doped region in the second portion of the intrinsic region and the third portion of the intrinsic region; and forming a source and a drain, wherein the source and the drain are electrically connected to the second heavily doped region and the third heavily doped region respectively.

2. The manufacturing method of the thin film transistor according to claim 1, wherein the source and the drain are arranged in a first direction, the first portion of the first heavily doped region and the quasi gate have an overlapping region, and a length of the overlapping region in the first direction is greater than a length of the intrinsic region in the first direction.

3. The manufacturing method of the thin film transistor according to claim 1, further comprising:

after forming the second heavily doped region and the third heavily doped region, etching the quasi gate to form a gate, wherein the first portion of the intrinsic region includes a first sub portion and a second sub portion connected to each other, the gate shields the first sub portion of the first portion of the intrinsic region, and the second sub portion of the first portion of the intrinsic region is located outside an area of the gate; and performing a third ion implantation with the gate as a mask to form a lightly doped region in the second sub portion of the first portion of the intrinsic region.

4. The manufacturing method of the thin film transistor according to claim 3, wherein the gate has a first edge and a second edge opposite to each other, a boundary between the intrinsic region and the lightly doped region is substantially aligned with the first edge of the gate, and the second edge of the gate overlaps with the first portion of the first heavily doped region.

5. The manufacturing method of the thin film transistor according to claim 4, wherein the source and the drain are arranged in a first direction, and a boundary between the second portion of the first heavily doped region and the second heavily doped region is separated from the second edge of the gate by a distance in the first direction.

6. The manufacturing method of the thin film transistor according to claim 1, wherein the source and the drain are arranged in a first direction, and a length of the intrinsic region in the first direction is less than or equal to 1.5 μm.

7. A thin film transistor, comprising:

a semiconductor layer, having a first heavily doped region, a second heavily doped region, a third heavily doped region, an intrinsic region and a lightly doped region, wherein the first heavily doped region is disposed between the second heavily doped region and the intrinsic region, the intrinsic region is disposed between the first heavily doped region and the lightly doped region, the lightly doped region is disposed between the intrinsic region and the third heavily doped region, and a boundary exists between the intrinsic region and the lightly doped region;

a gate insulating layer, disposed on the semiconductor layer;

a gate, disposed on the gate insulating layer, wherein the first heavily doped region includes a first portion and a second portion, the gate shields the intrinsic region and the first portion of the first heavily doped region, and the second portion of the first heavily doped region is located outside an area of the gate; and a source and a drain, electrically connected to the second heavily doped region and the third heavily doped region of the semiconductor layer respectively, wherein the source and the drain are arranged in a first direction, the first portion of the first heavily doped region and the gate have an overlapping region, and a length of the overlapping region in the first direction is greater than a length of the intrinsic region in the first direction.

8. The thin film transistor according to claim 7, wherein the gate has a first edge and a second edge opposite to each other, the boundary between the intrinsic region and the lightly doped region is substantially aligned with the first edge of the gate, and the second edge of the gate overlaps with the first portion of the first heavily doped region.

9. The thin film transistor according to claim 8, wherein a boundary between the second portion of the first heavily doped region and the second heavily doped region is separated from the second edge of the gate by a distance in the first direction.

10. The thin film transistor according to claim 7, wherein the length of the intrinsic region in the first direction is less than or equal to 1.5 μm.

* * * * *